United States Patent
Ladurner et al.

(10) Patent No.: US 8,657,489 B2
(45) Date of Patent: Feb. 25, 2014

(54) POWER SWITCH TEMPERATURE CONTROL DEVICE AND METHOD

(75) Inventors: Markus Ladurner, Villach (AT); Robert Illing, Villach (AT); Paolo Del Croce, Villach (AT); Bernhard Auer, Millstatt (AT)

(73) Assignee: Infineon Technologies AG, Neubiberg (DE)

( * ) Notice: Subject to any disclaimer, the term of this patent is extended or adjusted under 35 U.S.C. 154(b) by 877 days.

(21) Appl. No.: 12/824,891

(22) Filed: Jun. 28, 2010

(65) Prior Publication Data

US 2011/0316606 A1 Dec. 29, 2011

(51) Int. Cl.
*G01J 5/00* (2006.01)

(52) U.S. Cl.
USPC .......................... 374/129; 361/103

(58) Field of Classification Search
USPC .......................... 374/129; 361/103
See application file for complete search history.

(56) References Cited

U.S. PATENT DOCUMENTS

| 5,563,759 | A | 10/1996 | Nadd | |
|---|---|---|---|---|
| 5,563,760 | A | 10/1996 | Lowis et al. | |
| 6,628,491 | B1 * | 9/2003 | Tihanyi et al. | 361/93.8 |
| 7,339,773 | B2 | 3/2008 | Gergintschew | |
| 8,045,310 | B2 * | 10/2011 | Zanardi et al. | 361/93.9 |
| 8,296,093 | B2 * | 10/2012 | Zanardi et al. | 702/132 |
| 2004/0070910 | A1 * | 4/2004 | Gergintschew | 361/103 |
| 2006/0221527 | A1 | 10/2006 | Jacobson | |
| 2008/0055807 | A1 * | 3/2008 | Guillot et al. | 361/71 |
| 2011/0080207 | A1 * | 4/2011 | Ball | 327/512 |
| 2011/0157756 | A1 * | 6/2011 | Zanardi et al. | 361/94 |
| 2011/0316606 | A1 * | 12/2011 | Ladurner et al. | 327/378 |
| 2013/0027830 | A1 * | 1/2013 | Illing | 361/103 |

OTHER PUBLICATIONS

Graf, A., "Smart Power Switches for Automobile and Industrial Applications," VDE, ETG Conference: Contact Performance and Switching, Sep. 26-28, 2001, pp. 1-8.

* cited by examiner

*Primary Examiner* — Lisa Caputo
*Assistant Examiner* — Jamel Williams
(74) *Attorney, Agent, or Firm* — Slater & Matsil, L.L.P.

(57) ABSTRACT

An embodiment method for power switch temperature control comprises monitoring a power transistor for a delta-temperature fault, and monitoring the power transistor for an over-temperature fault. If a delta-temperature fault is detected, then the power transistor is commanded to turn off. If an over-temperature fault is detected, then the power transistor is commanded to turn off, and delta-temperature hysteresis cycling is disabled.

20 Claims, 6 Drawing Sheets

POWER SWITCH TEMPERATURE CONTROL DEVICE AND METHOD

TECHNICAL FIELD

The present invention relates generally to a device and method for power switches, and more particularly to a device and method for power switch temperature control.

BACKGROUND

Many industries set qualification requirements for electrical components. In the automotive industry, for example, the Automotive Electronics Council sets electrical requirements for automotive electronics with a series of standards such as AEC-Q100. Devices that meet these standards generally provide the robustness needed for functioning in the harsh automotive environment.

With the ever-increasing use of electrical components in the automotive industry, power switches for switching electrical power to the components are prevalent in automotive applications. Such electrical components may include motors, heaters, lamps, valves, magnets, and other electrical actuators.

Among the other requirements set forth in AEC-Q100, the standard states that power switches should be able to withstand more than 100 hours under a permanent short circuit condition. Based on increasing application and customer demands, the desired robustness of power switches in the next product generations may require that the devices withstand 1000 hours or more in a permanent short circuit condition.

SUMMARY OF THE INVENTION

Problems in the prior art are generally solved or circumvented, and technical advantages are generally achieved, by preferred embodiments of the present invention which limit the thermal toggling temperature swing of a power switch under a permanent short circuit condition.

In accordance with a preferred embodiment of the present invention, a method for power switch temperature control comprises monitoring a power transistor for a delta-temperature fault, and monitoring the power transistor for an over-temperature fault. If a delta-temperature fault is detected, then the power transistor is commanded to turn off. If an over-temperature fault is detected, then the power transistor is commanded to turn off, and delta-temperature hysteresis cycling is disabled.

In accordance with another preferred embodiment of the present invention, a method for controlling a power switch comprises monitoring a local temperature of a power transistor disposed on a semiconductor chip, monitoring a reference temperature of the semiconductor chip remote from the power transistor, comparing the local temperature with the reference temperature, and comparing the local temperature with an over-temperature threshold. If the local temperature exceeds the reference temperature by more than a delta-temperature threshold, then activating a delta-temperature transistor off signal. If the local temperature exceeds the over-temperature threshold, then activating an over-temperature transistor off signal, and disabling hysteresis cycling of the delta-temperature off signal.

In accordance with another preferred embodiment of the present invention, a semiconductor device comprises a power transistor, a device temperature sensor disposed in or near the power transistor, a remote temperature sensor disposed on or in a portion of the semiconductor substrate remote from the power transistor, a delta-temperature comparator and an over-temperature comparator. The delta-temperature comparator comprises a first input coupled to the device temperature sensor, a second input coupled to the remote temperature sensor, a delta-temperature transistor off output coupled to a gate of the power transistor, and a delta-temperature hysteresis cycling disable input. The over-temperature comparator comprises a first input coupled to the device temperature sensor, a second input coupled to an over-temperature threshold reference, and an over-temperature transistor off output coupled to the gate of the power transistor and to the hysteresis cycling disable input of the delta-temperature comparator.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a smart power switch in an automotive application. The invention may also be applied, however, to other power switches used in other industrial, commercial and consumer applications. For example, power switches may be used for switching power in electric or hybrid cars, variable speed refrigerators, air conditioners, audio switching amplifiers, switching power supplies, and the like. In addition to load switching, a power switch may have other internal functions, such as short circuit and overload protection, current flow sensing, load diagnostics, load control, and the like.

Transistors may be employed as switches in electrical circuits. In particular, a power metal oxide semiconductor field effect transistor ("MOSFET") may be employed as a switch in a load circuit for coupling a load to a source. The transistor may be either switched on, i.e., to its conducting state, thus allowing a current flow through the load circuit, or the transistor may be switched off, i.e., switched to its non-conducting state. When switching the transistor on, the electrical load may be coupled to a voltage or current source allowing a current to flow through the circuit, i.e., through the transistor and the load. When switching a transistor off, the transistor may disconnect the load from the source such that the transistor will stop a current flow in the load circuit.

A smart power switch may include a switching transistor and drive or control circuitry driving the transistor and providing, e.g., thermal, and current protection for the transistor. One type of power transistor is a vertical diffused or double-diffused metal oxide semiconductor field effect transistor ("DMOSFET"). Other types of power transistors include other types of power MOSFETs, power bipolar junction transistors ("BJT"s), power insulated gate bipolar transistors ("IGBT"s), and the like. The power transistor and the drive circuit may be fabricated and implemented on the same semiconductor chip or on separate chips, and may be mounted in the same device package or in separate device packages The drive or control circuitry may include protection circuitry to protect the power transistor from thermal deterioration or destruction due to overheating. Generally, thermal protection of a power transistor may include the use of two temperature sensors. The sensors used to measure temperature may be any type of element or device having a property that is temperature dependent. The temperature-sensitive element may be a transistor, resistor, thermocouple, diode, piezoelectric crystal, and the like.

The first temperature sensor may be located adjacent or near the DMOSFET, or located in, adjacent or near the active area of the DMOSFET to measure, e.g., the junction temperature of the DMOSFET. This sensor may be referred to as the device temperature sensor, element temperature sensor, or local temperature sensor. The second temperature sensor preferably is located remotely from the first sensor away from the DMOSFET, e.g., in, adjacent or near a coldest or one of the coldest areas of the chip. This sensor may be referred to as the remote temperature sensor or reference temperature sensor.

Temperature measurements from the two temperature sensors may be used to provide over-temperature ("OT") protection and delta-temperature ("dT") protection for the power transistor. Over-temperature protection is provided by monitoring the device temperature sensor for an over-temperature threshold. delta-temperature protection is provided by monitoring both temperature sensors for the difference between the two temperatures. That is, if a fault condition occurs, the temperature rises in the active area, and a temperature difference between the two sensors may be measured for a delta-temperature threshold value. Over-temperature protection and delta-temperature protection generally have different hysteresis values. As examples, a typical over-temperature hysteresis value is about 10 Kelvin (K), while a typical delta-temperature hysteresis value is about 60 K.

An example of a fault condition is a permanent resistive short circuit applied to the power switch at, e.g., an ambient temperature of 20° C. The transistor will heat up due to the short circuit, causing the delta-temperature protection circuit to toggle the transistor off and on as the difference between the two temperature measurements increases and decreases. This may be referred to as delta-temperature toggling. At some point, the over-temperature protection circuit will take over and toggle the transistor off and on as the device temperature measurement increases and decreases. In a permanent short circuit condition, the thermal equilibrium between power and temperature approximately may be reached at a chip temperature of about 130° C. The power transistor generally will toggle permanently under short circuit condition with an over-temperature hysteresis of about 10 K in the case of a resistive short circuit.

Another example of a fault condition is a permanent inductive short circuit applied to the power switch (for example, as in the Load Short Circuit ("LCS") test for Q100). When the short circuit includes an inductive load, the current flow in the load circuit generally will not stop immediately when the power transistor is switched off. An inductor in the load circuit generally will discharge its stored energy, such that the current flowing in the load circuit and the transistor generally decreases with time until the inductor is discharged.

Figure 1:
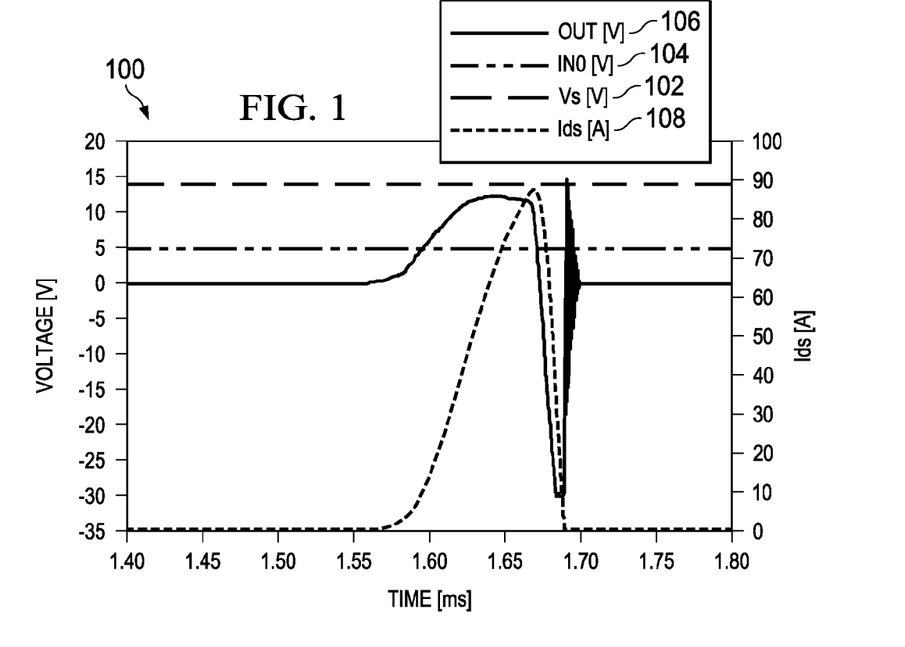
FIG. 1 is a timing diagram showing electrical behavior of a short circuit pulse in a power switch.
Figure 2:
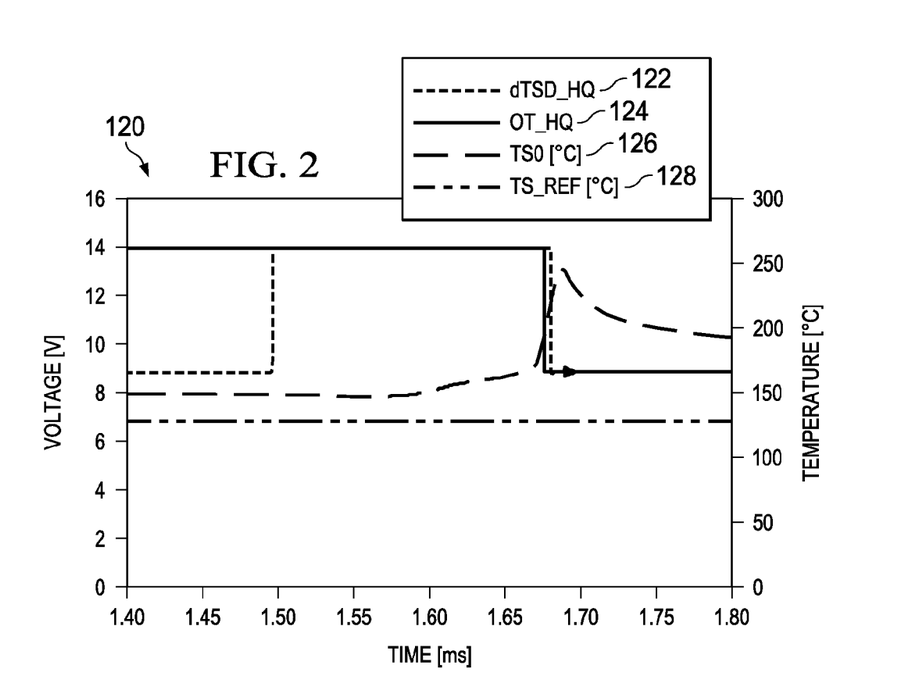
FIG. 2 is a timing diagram showing thermal behavior of a short circuit pulse in a power switch.

In the case of an inductive load, the switch generally does not toggle with the 10 K over-temperature hysteresis value, due to the inductive clamping at switching off. FIGS. 1 and 2 are timing diagrams illustrating the electrical and thermal behavior, respectively, of an inductive load short circuit pulse applied to a power switch having over-temperature and delta-temperature protection. Electrical timing chart 100 in FIG. 1 displays a graph of power supply voltage 102, input voltage 104, output voltage 106 and transistor current 108 as a function of time. As can be seen in the figure, the power supply voltage 102 and input voltage 104 remain constant at their respective values of about 14 volts and about 5 volts. The short circuit pulse causes the transistor current 108 to spike from zero amperes to just under 90 amps before settling back down to zero amps. Likewise, the short circuit pulse causes the output voltage 106 to jump from zero volts to about 12 volts, negatively spike at about −30 volts, and then positively spike at about 15 volts. The output voltage then oscillates between decreasing negative and positive voltages before settling back down to zero volts.

Thermal timing chart 120 in FIG. 2 displays a graph of delta-temperature signal 122, over-temperature signal 124, device or element temperature 126 and reference temperature 128 as a function of time. As can be seen in the figure, the reference temperature 128 remains constant at about 130° C. The short circuit pulse causing the increased transistor current illustrated in FIG. 1 raises the transistor temperature 126 until the over-temperature threshold is reached. Upon sensing the over-temperature threshold condition, the over-temperature protection circuitry is activated and the power transistor is switched off by the over-temperature signal 124. During the switching off phase, inductive clamping occurs, causing high power consumption in the transistor. This leads to a further temperature increase in the transistor until the delta-temperature threshold is reached. Upon sensing the delta-temperature threshold condition, the delta-temperature protection circuitry is activated, and the transistor is switched off by the delta-temperature signal 122. With the delta-temperature circuitry controlling the transistor, the power transistor toggles with the 60 K delta-temperature hysteresis instead of the much lower 10 K over-temperature hysteresis. In simulation, with delta-temperature hysteresis, the maximum difference temperature between the coldest and hottest points on the chip was about 150 K.

Figure 3:
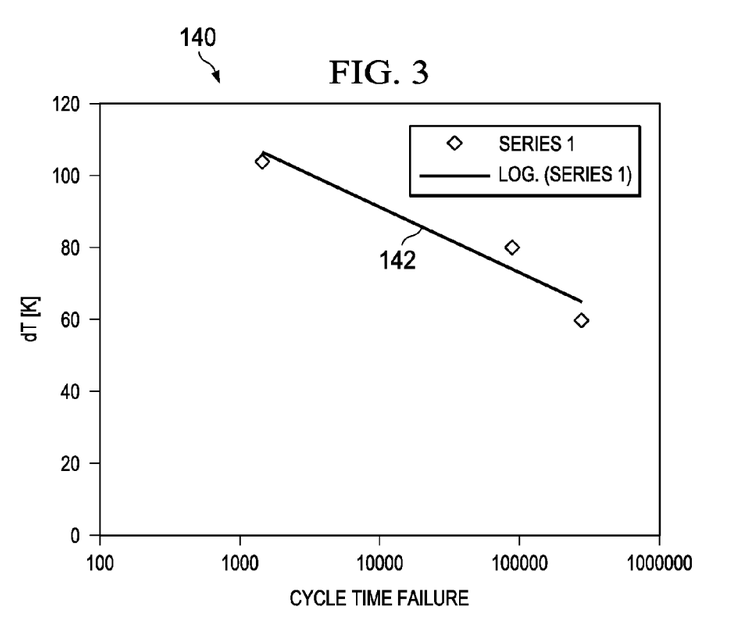
FIG. 3 is a graph of a power switch cycles to failure versus delta-temperature.

Toggling the transistor with a high delta-temperature hysteresis, however, generally is detrimental to the transistor and reduces the transistor short circuit robustness. Generally, the maximum delta-temperature experienced by a power switch is directly correlated to the lifetime of the switch. FIG. 3 is a graph 140 illustrating that power switch lifetime measured in cycle-times-to-failure is directly affected by the maximum temperature difference experienced by the power switch. In other words, generally a higher delta-temperature value during toggling causes transistor to fail faster in less cycles.

Lowering the delta-temperature or maximum temperature difference between the coldest and hottest points on the chip substantially increases the robustness and operating life of the power transistor.

Figure 4:
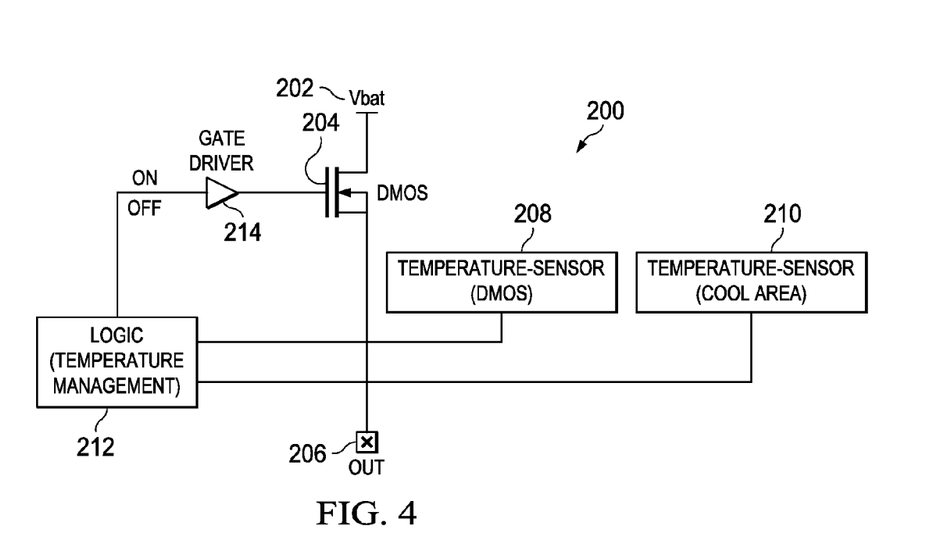
FIG. 4 is a block diagram of a power switch with temperature control logic.

FIG. 4 illustrates a high-level block diagram of a power switch 200 having a delta-temperature hysteresis disable function. Specifically, power switch 200 contains circuitry to switch off the delta-temperature hysteresis when the over-temperature signal is active. In other words, delta-temperature hysteresis may be disabled during over-temperature hysteresis toggling, so that the lower over-temperature hysteresis temperature difference is followed instead of the higher delta-temperature hysteresis temperature difference.

DMOSFET power transistor 204 shown in FIG. 4 is implemented on a semiconductor chip and is coupled as a high-side switch between a power supply 202 and power switch output 206, which may be connected to a load requiring power (and which in turn is connected to ground). A drain of DMOSFET 204 may be coupled to the power supply 202, and a source of the DMOSTFET 206 may be coupled to the output 206 and load. Alternatively, the switch may be coupled as a low-side switch between the load (which is also connected to a power supply) and ground. In this case a drain of the transistor may be connected to the load, while a source of the transistor may be connected to ground.

A device temperature sensor 208 is located in the active area of DMOSFET 204 to measure the junction temperature of the transistor. Reference temperature sensor 210 is located remotely from DMOSFET 204 in a coldest area of the chip. Temperature protection logic 212 receives temperature measurements from device temperature sensor 208 and reference temperature sensor 210. Based on the values of the two measurements, temperature protection logic generates an on/off output signal to gate driver 214, which commands MOSFET 204 either on or off via its gate input.

Specifically, over-temperature may be determined from the device temperature sensor 208 measurement, and delta-temperature may be determined from the difference between the device temperature sensor 208 and reference temperature sensor 210 measurements. Temperature protection logic 212 determines whether either over-temperature or delta-temperature thresholds have been reached, in which case temperature protection logic 212 outputs an off signal to gate driver 214 to command DMOSFET 204 to turn off. In addition, if the over-temperature threshold has been reached, temperature protection circuitry 212 disables the delta-temperature hysteresis, so that the transistor toggling is controlled by the over-temperature hysteresis, not delta-temperature hysteresis.

Figure 5:
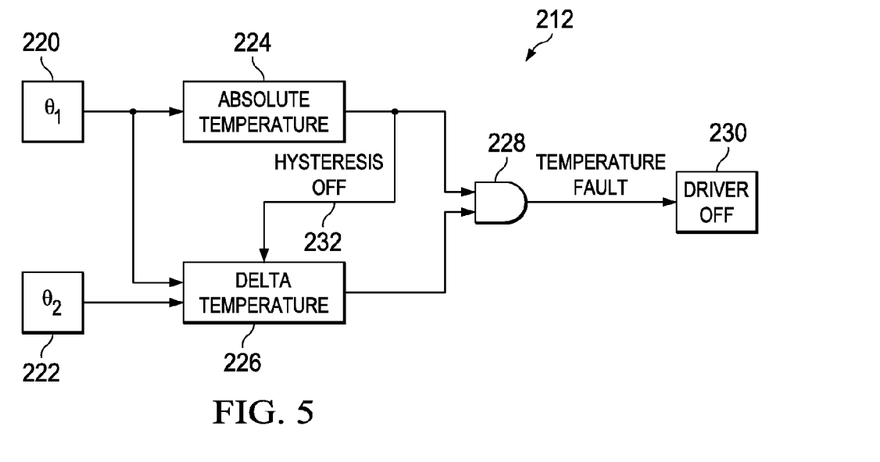
FIG. 5 is a block diagram of the temperature control logic of FIG. 4.

FIG. 5 illustrates a lower level block diagram of the temperature protection circuitry 212 of FIG. 4. A device temperature measurement signal 220 is input to over-temperature comparator 224, and to delta-temperature comparator 226. A remote temperature measurement signal 222 is input to delta-temperature comparator 226. The outputs of the over-temperature comparator 224 and the delta-temperature comparator 226 are input to AND logic 228 for generation of transistor driver off signal 230 if there is a temperature fault. In this embodiment, all three fault signals are active low. Alternatively, the logic may be implemented using an OR function with active high signals. The output of the over-temperature comparator 224 additionally is fed into the delta-temperature comparator 226 at a delta-temperature hysteresis off input 232. Alternatively, a separate control line from the over-temperature comparator 224 to the delta-temperature comparator 226 may be used.

In operation, delta-temperature comparator 226 compares the device temperature measurement 220 to the remote temperature measurement 222. If the difference between the device temperature measurement 220 and the remote temperature measurement 222 is equal to or greater than a delta-temperature threshold, a delta-temperature fault exists and delta-temperature comparator 226 outputs a delta-temperature fault signal to AND logic 228, which generates a driver off signal 230 to turn off the power transistor.

Over-temperature comparator 224 compares device temperature measurement 220 to a reference voltage representing the over-temperature threshold value. If the device temperature measurement 220 is equal to or greater than the reference voltage, an over-temperature fault exists and over-temperature comparator 224 outputs an over-temperature fault signal to AND logic 228, which generates a driver off signal 230 to turn off the power transistor. Additionally, the over-temperature fault signal commands the delta-temperature comparator 226, via its hysteresis off input 232, to turn off or disable delta-temperature hysteresis. Thus, the delta-temperature hysteresis is turned off when the over-temperature fault signal is active, so that the over-temperature hysteresis controls toggling of the power transistor.

Figure 6:
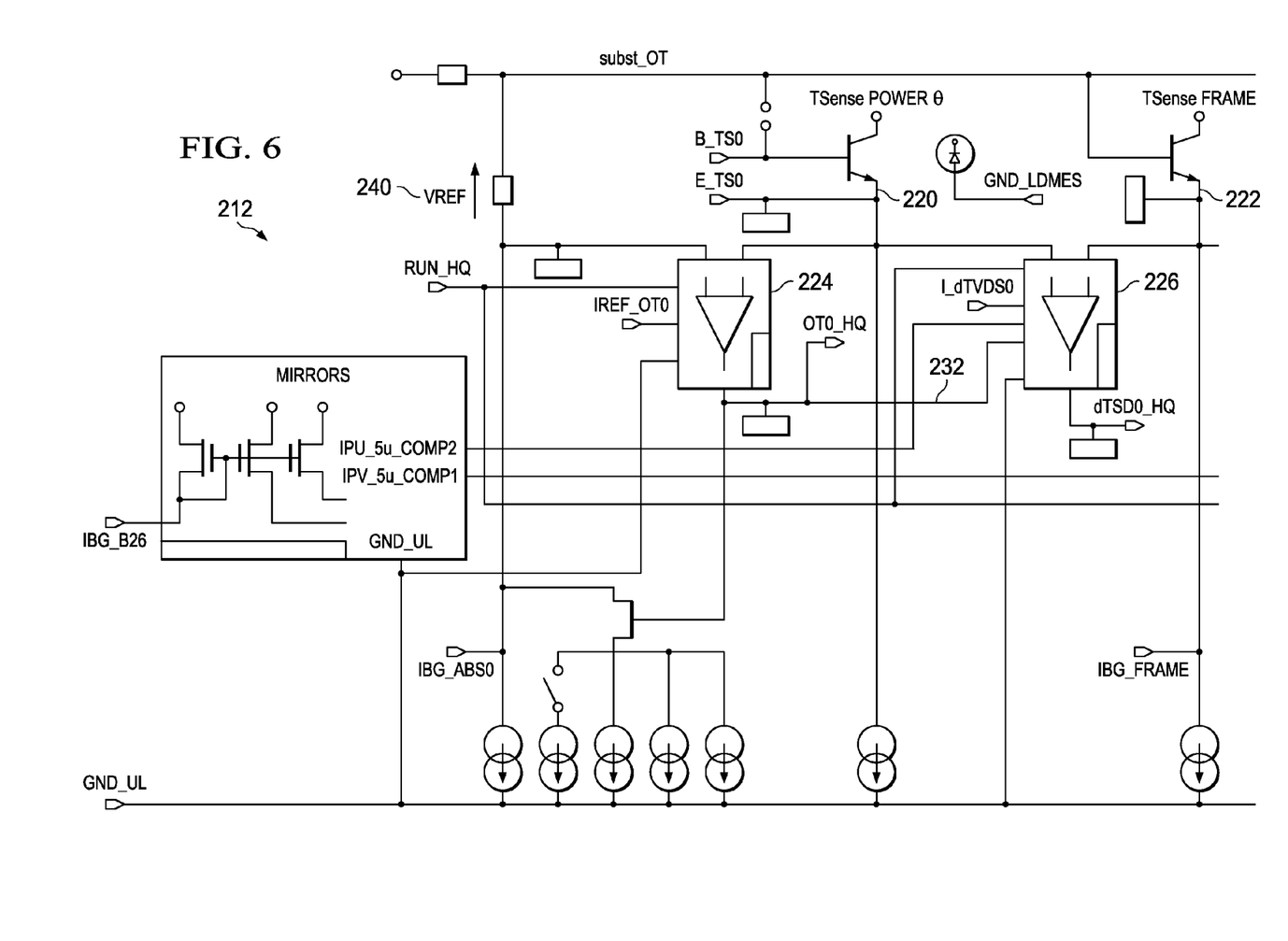
FIG. 6 is a schematic of the temperature control logic of FIG. 5.

FIG. 6 illustrates a schematic of the temperature protection circuitry 212 of FIG. 4. A device temperature measurement signal 220 is input to over-temperature comparator 224 and to delta-temperature comparator 226. A remote temperature measurement signal 222 is input to delta-temperature comparator 226. The outputs of the over-temperature comparator 224 and the delta-temperature comparator 226 are combined for generation of a transistor driver off signal if one of the two comparators indicates a temperature fault. The output of the over-temperature comparator 224 additionally is fed into the delta-temperature comparator 226 at a delta-temperature hysteresis off input 232.

In operation, delta-temperature comparator 226 compares the device temperature measurement 220 to the remote temperature measurement 222. If the difference between the device temperature measurement 220 and the remote temperature measurement 222 is equal to or greater than a delta-temperature threshold, a delta-temperature fault exists and delta-temperature comparator 226 outputs a delta-temperature fault signal to turn off the power transistor. The delta-temperature threshold may be set to a temperature between 10K and 100K, between 100K and 200K, or between 200K and 300K. Alternatively, the delta-temperature threshold may be set to a temperature of 60K, 80K, or 100K, for example.

Over-temperature comparator 224 compares device temperature measurement 220 to a reference voltage 240, which represents the over-temperature threshold value. In this embodiment, a reference voltage of about 390 mV represents an over-temperature threshold of about 175° C. Alternatively, the over-temperature threshold may be set to a temperature between 100° C. and 150° C., between 150° C. and 175° C., or between 175° C. and 200° C. Alternatively, the over-temperature threshold may be set to a temperature of 150° C., 175° C., or 200° C., for example.

If the device temperature measurement 220 is equal to or greater than the reference voltage, an over-temperature fault exists and over-temperature comparator 224 outputs an over-temperature fault signal to turn off the power transistor. Additionally, the over-temperature fault signal commands the delta-temperature comparator 226, via its hysteresis off input 232, to turn off or disable delta-temperature hysteresis. Thus, the delta-temperature hysteresis is turned off when the over-temperature fault signal is active, so that the over-temperature hysteresis controls toggling of the power transistor. In this embodiment, the over-temperature hysteresis value is designed to be about 10 K (which results in a real value of about 11.5 K). Alternatively, the over-temperature hysteresis may be designed for about 20 K, about 30 K, about 40 K, and the like (and resulting in real values approximating the designed values).

Figure 7:
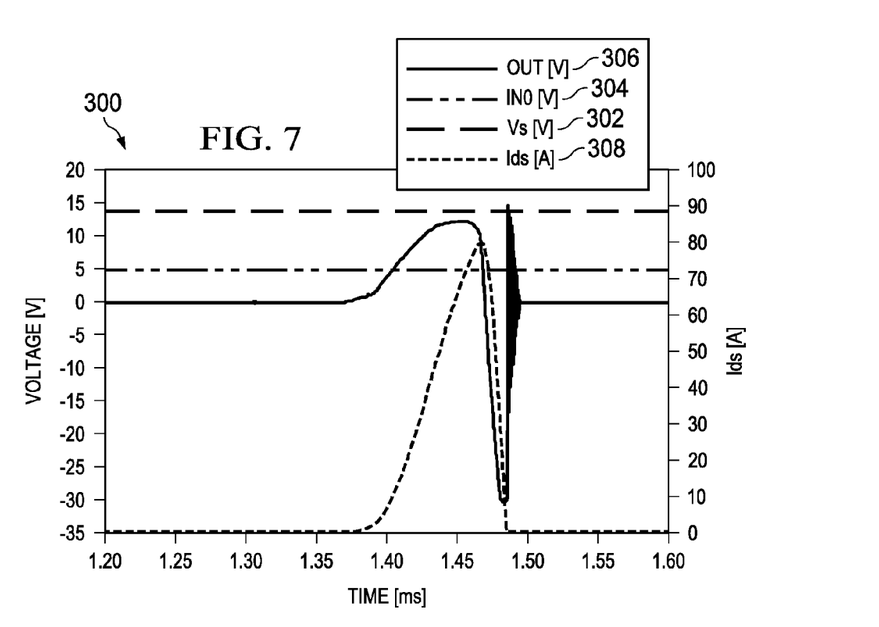
FIG. 7 is a timing diagram showing electrical behavior of a short circuit pulse in a power switch.
Figure 8:
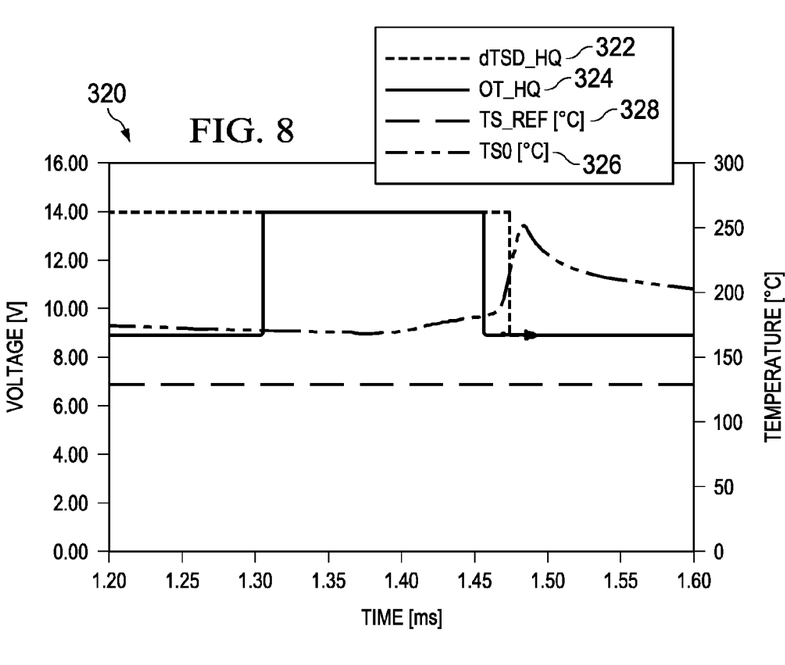
FIG. 8 is a timing diagram showing thermal behavior of a short circuit pulse in a power switch.

FIGS. 7 and 8 are timing diagrams illustrating the electrical and thermal behavior, respectively, of an inductive load short circuit pulse applied to a power switch having over-temperature and delta-temperature protection and having a delta-temperature hysteresis disable feature. Electrical timing chart 300 in FIG. 7 displays a graph of power supply voltage 302, input voltage 304, output voltage 306 and transistor current 308 as a function of time. As can be seen in the figure, the power supply voltage 302 and input voltage 304 remain constant at their respective values of about 14 volts and about 5 volts. The short circuit pulse causes the transistor current 308 to spike from zero amperes to about 80 amps before settling back down to zero amps. Likewise, the short circuit pulse causes the output voltage 306 to jump from zero volts to about 12 volts, negatively spike at about −30 volts, and then positively spike at about 15 volts. The output voltage then oscillates between decreasing negative and positive voltages before settling back down to zero volts.

Thermal timing chart 320 in FIG. 2 displays a graph of delta-temperature signal 322, over-temperature signal 324, transistor temperature 326 and reference temperature 328 as a function of time. As can be seen in the figure, the reference temperature 328 remains constant at about 130° C. The short circuit pulse causing the increased transistor current illustrated in FIG. 7 raises the transistor temperature 326 until the over-temperature threshold is reached at about 180° C. Upon sensing the over-temperature threshold condition, the over-temperature protection circuitry is activated and the power transistor is switched off by the over-temperature signal 324.

The over-temperature protection circuitry also disables delta-temperature hysteresis. During the switching off phase, inductive clamping occurs, causing high power consumption in the transistor. This leads to a further temperature increase in the transistor until the delta-temperature threshold is reached. Upon sensing the delta-temperature threshold condition, the delta-temperature protection circuitry is activated, and the transistor is switched off by the delta-temperature signal 322, but without delta-temperature hysteresis. With the delta-temperature hysteresis turned off, the over-temperature circuitry controls the transistor, and the power transistor toggles with the 10 K over-temperature hysteresis instead of the much higher 60 K delta-temperature hysteresis. In simulation, with delta-temperature hysteresis turned off, the maximum difference temperature between the coldest and hottest points on the chip was about 115 K. Alternatively, the over-temperature hysteresis may be 40 K or less, 35 K or less, 30 K or less, 20 K or less, 15 K or less, or 10K or less. Furthermore, the delta-temperature hysteresis alternatively may be 40 K or greater, 45 K or greater, 50 K or greater, or 60 K or greater.

Figure 9:
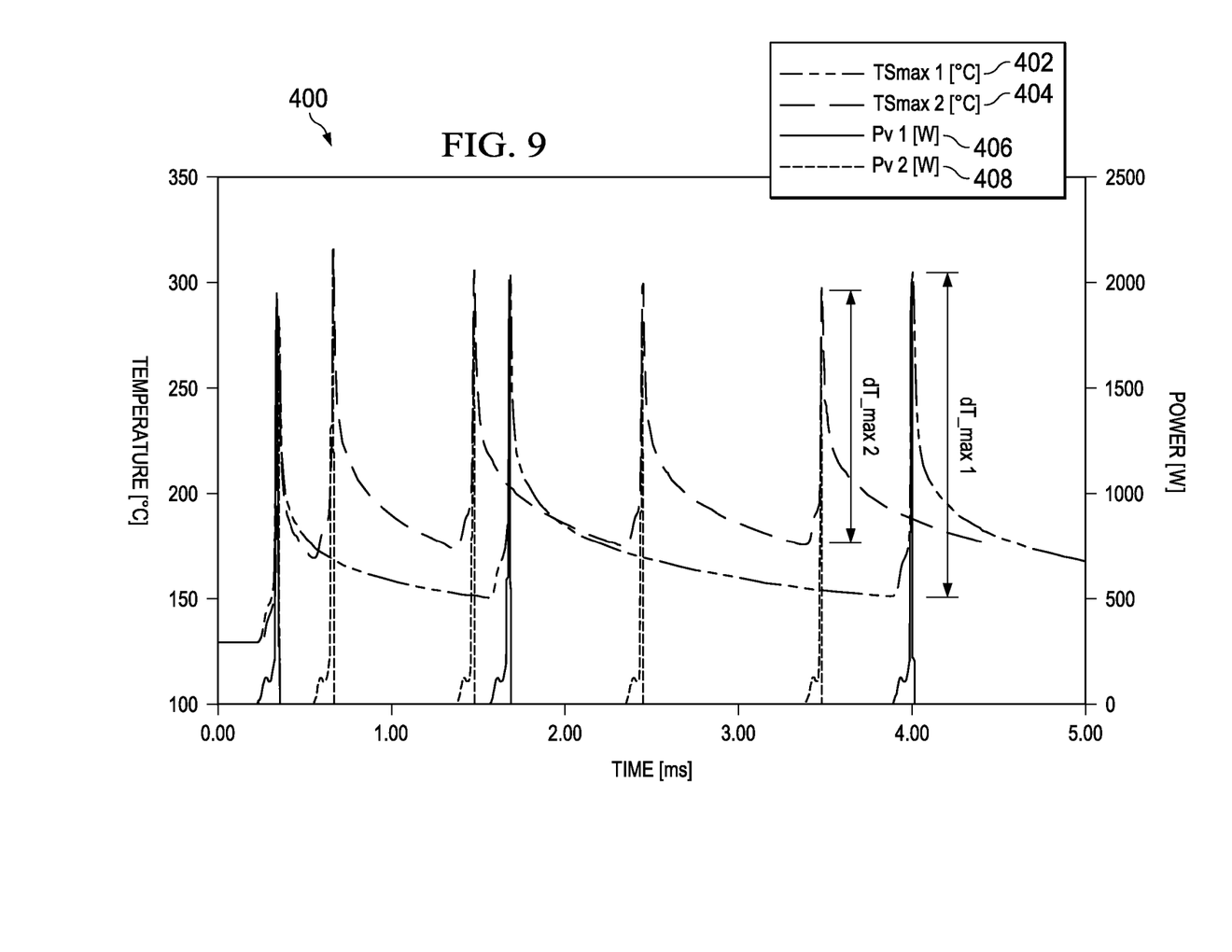
FIG. 9 is a timing diagram comparing the thermal behavior of short circuit pulses in a prior art power switch and an embodiment power switch.

FIG. 9 illustrates a timing diagram 400 comparing the thermal behavior of a prior art power switch and an embodiment power switch. In the prior art power switch, delta-temperature hysteresis generally controls the toggling, while in the embodiment power switch, over-temperature hysteresis generally controls toggling. As can be seen in FIG. 9, the delta-temperature hysteresis-controlled transistor temperature 402 shows a maximum temperature swing of about 150 K. In contrast, the over-temperature hysteresis-controlled transistor temperature 404 shows a maximum temperature swing of about 115 K. Thus, in this example, the delta-temperature hysteresis disable function generally reduces the maximum difference temperature from about 150 K to about 115 K. Of course, the actual temperature difference achieved will depend on the specific components implemented and on the particular application. In general, the maximum difference temperature of a power switch controlled by over-temperature hysteresis will be substantially less than that of a power switch controlled by delta-temperature hysteresis. It also may be noted that with the smaller temperature swing, the temperature swing cycles occur more frequently, accompanied by more frequent power surges in over-temperature hysteresis power curve 408, as compared to delta-temperature power curve 406.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of controlling a power switch, the method comprising:
monitoring a local temperature of a power transistor disposed on a semiconductor chip;
monitoring a reference temperature of the semiconductor chip remote from the power transistor;
comparing the local temperature with the reference temperature;
comparing the local temperature with an over-temperature threshold;
if the local temperature exceeds the reference temperature by more than a delta-temperature threshold, then activating a delta-temperature transistor off signal; and
if the local temperature exceeds the over-temperature threshold, then
(a) activating an over-temperature transistor off signal, and
(b) disabling hysteresis cycling of the delta-temperature off signal.

2. The method of claim 1, further comprising combining the delta-temperature transistor off signal and the over-temperature transistor off signal to form a combined transistor off signal.

3. The method of claim 1, further comprising an over-temperature hysteresis cycling value of about 35 K or less, and a delta-temperature hysteresis cycling value of about 45 K or greater.

4. The method of claim 1, further comprising an over-temperature hysteresis cycling value of about 10 K or less, and a delta-temperature hysteresis cycling value of about 60 K or greater.

5. The method of claim 1, further comprising, after disabling hysteresis cycling of the delta-temperature off signal, toggling the power transistor with an-over temperature hysteresis.

6. The method of claim 1, further comprising, after activating the delta-temperature transistor off signal, if the local temperature does not exceed the over-temperature threshold, then toggling the power transistor with a delta-temperature hysteresis.

7. A semiconductor device comprising:
a power transistor;
a device temperature sensor disposed in or near the power transistor;
a remote temperature sensor disposed on or in a portion of a semiconductor substrate remote from the power transistor;
a delta-temperature comparator comprising
(a) a first input coupled to the device temperature sensor,
(b) a second input coupled to the remote temperature sensor,
(c) a delta-temperature transistor off output coupled to a gate of the power transistor, and
(d) a delta-temperature hysteresis cycling disable input; and
an over-temperature comparator comprising
(a) a first input coupled to the device temperature sensor,
(b) a second input coupled to an over-temperature threshold reference, and
(c) an over-temperature transistor off output coupled to the gate of the power transistor and to the hysteresis cycling disable input of the delta-temperature comparator.

8. The semiconductor device of claim 7, wherein the power transistor is a metal oxide semiconductor field effect transistor (MOSFET).

9. The semiconductor device of claim 8, wherein the MOSFET is a double-diffused MOSFET (DMOSFET).

10. The semiconductor device of claim 8, wherein the MOSFET has a drain coupled to a power supply input, and a source coupled to a load output.

11. The semiconductor device of claim 7, further comprising a logic AND having a first input coupled to the delta-temperature transistor off output, a second input coupled to the over-temperature transistor off output, and an AND output coupled to the gate of the transistor.

12. The semiconductor device of claim 11, further comprising a gate driver having an input coupled to the AND output, and an output coupled to the gate of the transistor.

13. The semiconductor device of claim 7, wherein the over-temperature threshold reference is an over-temperature threshold reference voltage.

14. The semiconductor device of claim 7, wherein the device temperature sensor is disposed in or near an active area of the power transistor.

15. A method for power switch temperature control, the method comprising:
monitoring a power transistor for a delta-temperature fault;
monitoring the power transistor for an over-temperature fault;
if a delta-temperature fault is detected, then commanding the power transistor to turn off; and
if an over-temperature fault is detected, then commanding the power transistor to turn off, and disabling delta-temperature hysteresis cycling.

16. The method of claim 15, further comprising, after a first over-temperature fault occurs, detecting an ending of the first over-temperature fault, and commanding the power transistor to turn on.

17. The method of claim 16, further comprising, after detecting the ending of the first over-temperature fault, enabling delta-temperature hysteresis cycling.

18. The method of claim 16, further comprising, after detecting the ending of the first over-temperature fault, detecting a second over-temperature fault, and commanding the power transistor to turn off.

19. The method of claim 18, further comprising, after the detecting the second over-temperature fault, disabling delta-temperature hysteresis cycling.

20. The method of claim 15, further comprising, if neither a delta-temperature fault nor an over-temperature fault is detected, then commanding the power transistor to turn on.

* * * * *